(12) United States Patent
Brekelmans

(10) Patent No.: US 9,419,573 B2
(45) Date of Patent: Aug. 16, 2016

(54) VARIABLE GAIN TRANSIMPEDANCE AMPLIFIER

(71) Applicant: NXP B.V., Eindhoven (NL)

(72) Inventor: Johannes Hubertus Antonius Brekelmans, Nederweert (NL)

(73) Assignee: NXP, B.V., Eindhoven (NL)

( * ) Notice: Subject to any disclaimer, the term of this patent is extended or adjusted under 35 U.S.C. 154(b) by 18 days.

(21) Appl. No.: 14/317,987

(22) Filed: Jun. 27, 2014

(65) Prior Publication Data

US 2015/0381129 A1    Dec. 31, 2015

(51) Int. Cl.
| | |
|---|---|
| *H03F 1/34* | (2006.01) |
| *H03G 3/18* | (2006.01) |
| *H03F 3/08* | (2006.01) |
| *H03F 3/195* | (2006.01) |
| *H03F 3/45* | (2006.01) |
| *H03G 1/00* | (2006.01) |

(52) U.S. Cl.
CPC .. *H03G 3/18* (2013.01); *H03F 1/34* (2013.01); *H03F 3/087* (2013.01); *H03F 3/195* (2013.01); *H03F 3/45475* (2013.01); *H03G 1/0088* (2013.01); *H03F 2200/336* (2013.01); *H03F 2200/451* (2013.01); *H03F 2203/45116* (2013.01); *H03F 2203/45512* (2013.01); *H03F 2203/45514* (2013.01); *H03F 2203/45522* (2013.01); *H03F 2203/45526* (2013.01); *H03F 2203/45528* (2013.01); *H03F 2203/45534* (2013.01); *H03F 2203/45536* (2013.01); *H03F 2203/45562* (2013.01); *H03F 2203/45591* (2013.01); *H03F 2203/45594* (2013.01); *H03F 2203/45616* (2013.01); *H03F 2203/45618* (2013.01); *H03F 2203/45644* (2013.01); *H03F 2203/45686* (2013.01); *H03F 2203/45702* (2013.01)

(58) Field of Classification Search
CPC .............................. H03F 1/34; H03F 2200/138
USPC ..................................................... 330/86, 282
See application file for complete search history.

(56) References Cited

U.S. PATENT DOCUMENTS

| | | | | |
|---|---|---|---|---|
| 8,044,718 | B2* | 10/2011 | Nicollini | H03G 1/0088 330/254 |
| 2005/0168289 | A1 | 8/2005 | Schrodinger | |
| 2010/0315164 | A1 | 12/2010 | Vakilian | |
| 2010/0315635 | A1 | 12/2010 | Janzen et al. | |
| 2012/0008717 | A1 | 1/2012 | van Sinderen et al. | |
| 2012/0021712 | A1 | 1/2012 | Mikhemar et al. | |

FOREIGN PATENT DOCUMENTS

WO    2007110816 A1    10/2007

OTHER PUBLICATIONS

Extended European Search Report, 15172191.7, Oct. 9, 2015.

* cited by examiner

*Primary Examiner* — Steven J Mottola

(57) ABSTRACT

Embodiments of variable gain transimpedance amplifiers are described. In an embodiment, the variable gain transimpedance amplifier may include an amplifier coupled to an adjustable gain feedback network, the adjustable gain feedback network including a selectable set of Resistor-Capacitor (RC) branches, each RC branch having one or more unit RC elements, each unit RC element being comprised of a unit resistor and a unit capacitor arranged in parallel.

19 Claims, 8 Drawing Sheets

| 502 | 504 | 506 | 508 | 510 | 512 | 514 | 516 | 518 | 520 | 522 | 524 |
|---|---|---|---|---|---|---|---|---|---|---|---|
| # | GAIN | GAIN | Rfb | Cfb | Rfbi | PARALLEL UNITS # EXACT | PARALLEL UNITS # ROUNDED | Rfbi | Rfb | GAIN | GAIN ERROR |
| | dB | V/V | kΩ | pF | kΩ | | | kΩ | kΩ | dB | dB |
| 0 | 0 | 1 | 7 | 1.135 | 7 | 4.000 | 4.000 | 7 | 7.000 | 0.000 | 0.000 |
| 1 | -2 | 0.794 | 5.560 | 1.429 | 27.035 | 1.036 | 1.000 | 28 | 5.600 | -1.938 | 0.062 |
| 2 | -4 | 0.631 | 4.417 | 17.99 | 21.475 | 1.304 | 1.333 | 21 | 4.421 | -3.991 | 0.009 |
| 3 | -6 | 0.501 | 3.508 | 2.265 | 17.058 | 1.641 | 1.667 | 16.8 | 3.500 | -6.021 | -0.021 |
| 4 | -8 | 0.398 | 2.787 | 2.851 | 13.550 | 2.066 | 2.000 | 14 | 2.800 | -7.959 | 0.041 |
| 5 | -10 | 0.316 | 2.214 | 3.589 | 10.763 | 2.602 | 2.667 | 10.5 | 2.211 | -10.012 | -0.012 |
| 6 | -12 | 0.251 | 1.758 | 4.519 | 8.549 | 3.275 | 3.333 | 8.4 | 1.750 | -12.041 | -0.041 |

FIG. 5

VARIABLE GAIN TRANSIMPEDANCE AMPLIFIER

A transimpedance amplifier ("TIA") is a current-to-voltage converter, usually built around an operational amplifier ("OPAMP"). TIAs can be used as amplifying stage with photo multipliers, photo detectors, accelerometers, and other types of sensors. TIAs can also be used as building block in signal receiver circuits for frequency conversion and/or for signal demodulation and image separation.

A common TIA architecture includes an amplifier and a feedback path between an output terminal and an inverting input terminal of the amplifier. The feedback path may include a feedback resistor and a feedback capacitor arranged in parallel. The feedback resistor sets the low-frequency gain of the TIA. The feedback capacitor together with the resistor forms a low pass filter that determines the high-frequency response of the TIA.

For some applications it is desired to have a TIA with a gain that is variable. Variable gain TIA can be achieved by introducing means to vary the value of feedback resistor.

One problem that may arise with a gain-adjustable TIA is that while gain is changing the bandwidth may need to remain constant. The bandwidth of the TIA is determined by the product of the feedback resistor value and feedback capacitor value. So, when changing the resistor value the capacitor value needs to simultaneously change inversely proportional to fulfill the constant bandwidth constraint. Switchable networks of fixed sized feedback resistors and feedback capacitors have been used, but since resistors and capacitors are formed during different semiconductor manufacturing steps, it is very difficult to obtain differently sized but accurately matched pairs of resistors and capacitors that deliver a constant RC product. If separately adjustable feedback resistors and feedback capacitors are used, calibration is often required to find the resistor and capacitor value combination needed for a certain TIA gain setting and TIA bandwidth. The provision for enabling such calibration, the calibration procedure and the memory requirement for storing the result, makes the use of variable sized feedback resistors and capacitors expensive for use in integrated circuits.

Embodiments of variable gain transimpedance amplifiers are described. In an embodiment, a variable gain transimpedance amplifier may include an amplifier connected to an adjustable gain feedback network. The adjustable gain feedback network may include a selectable set of Resistor-Capacitor ("RC") branches. Each RC branch may include one or more unit RC elements, and each unit RC element may include a unit resistor and a unit capacitor arranged in parallel.

Embodiments of integrated circuits are also described. In an embodiment, an integrated circuit may include an input interface configured to receive an input signal for an adjustable transimpedance amplifier. The integrated circuit also includes an adjustable transimpedance amplifier. In an embodiment, the adjustable transimpedance amplifier may include an operational amplifier coupled to an adjustable gain feedback network. The adjustable gain feedback network may include a selectable set of RC branches. Each RC branch may include one or more unit RC elements, and each unit RC element may include a unit resistor and a unit capacitor arranged in parallel.

Embodiments of a method for using a variable gain transimpedance amplifier are also described. In an embodiment, the method involves providing an input signal to an adjustable transimpedance amplifier, the adjustable transimpedance amplifier having an adjustable gain feedback network comprising a set of selectable RC branches, each RC branch having one or more unit RC elements, each unit RC element being comprised of a unit resistor and a unit capacitor arranged in parallel. Additionally, the method may involve selecting one or more of the RC branches to set a gain value for the transimpedance amplifier.

Other aspects in accordance with the invention will become apparent from the following detailed description, taken in conjunction with the accompanying drawings, illustrated by way of example of the principles of the invention.

FIG. 5 depicts a table of gain steps associated with the embodiments of feedback branches illustrated in FIGS. 4A-4F.

Throughout the description, similar reference numbers may be used to identify similar elements.

Figure 1:
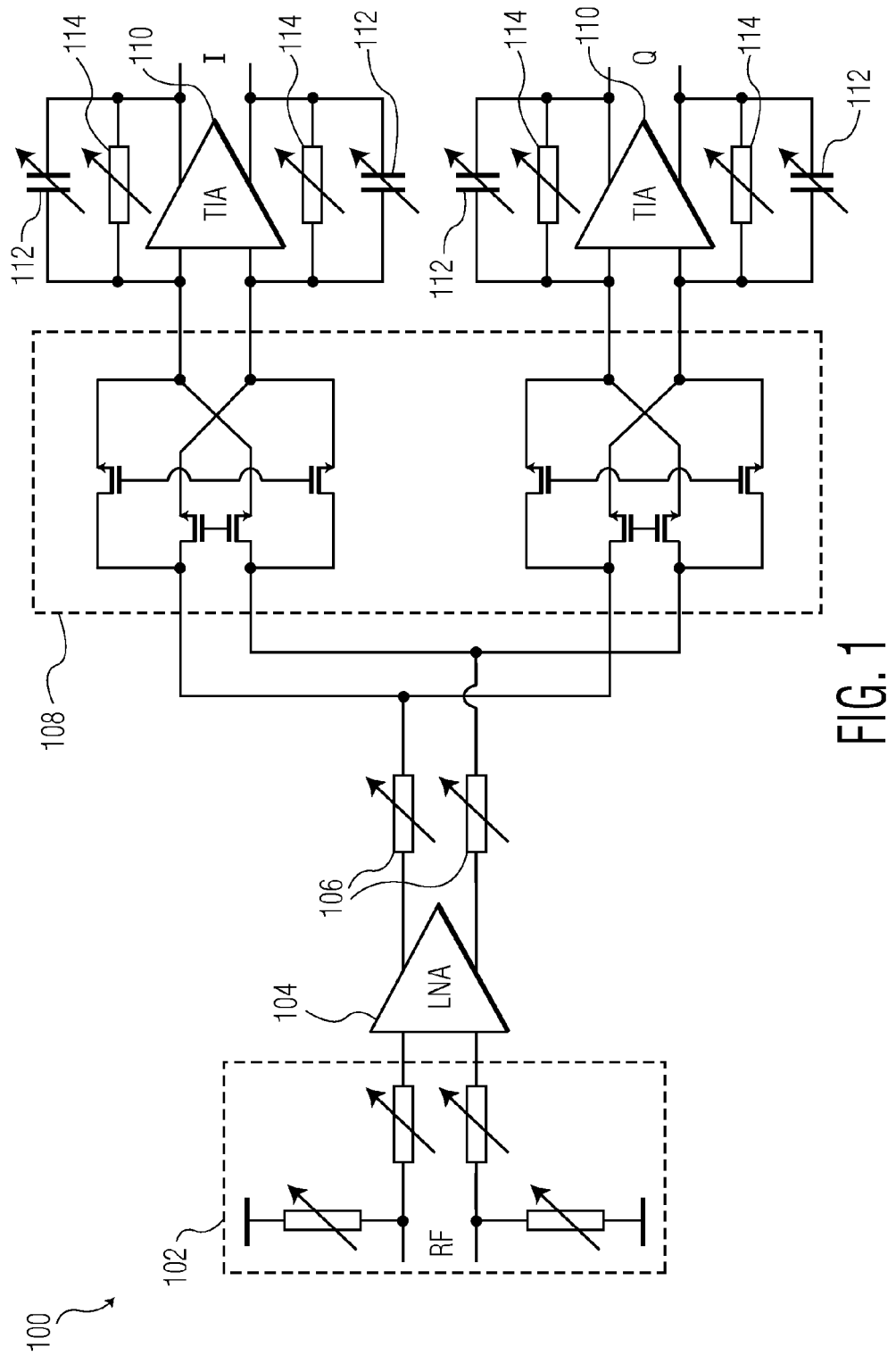
FIG. 1 depicts a schematic diagram of one embodiment of a system for a variable gain TIA.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments enable variable gain control of a TIA. Advantageously, the embodiments may use unit RC elements for improved manufacturability. Additionally, use of the unit RC elements may reduce error in gain step increments for more reliable and consistent gain steps. Use of the unit RC elements may additionally provide for improved frequency stability in the variable gain TIA. While the present embodiments are described specifically in the context of a TIA, one of ordinary skill will recognize that the described embodiments may be implemented with various other amplifier circuits configured to perform various functions. Description of the present embodiments in the context of a TIA is not intended to limit application of the present embodiments to any specific feedback network for any specific type of amplifier.

Embodiments of devices for a variable gain TIA may be implemented in a number of different types of electronic devices. Some examples of electronic devices include semiconductor devices for signal receivers, automotive or marine applications, controllers for factory automation systems or sensors, components of alternative power systems, etc. There is no limitation on the general types of applications that might incorporate embodiments of the technology described herein.

FIG. 1 depicts a schematic diagram of one embodiment of a receiver circuit 100 which may include one or more variable gain TIAs 110. Although the variable gain TIAs 110 are described with reference to the receiver circuit 100, one of ordinary skill will recognize a variety of other applications in which the variable gains TIAs 110 described herein may be useful.

In an embodiment, the receiver circuit 100 includes a Radio Frequency (RF) input gain control 102 for setting a gain or attenuation of the signal input to the Low Noise Amplifier ("LNA") 104. Voltage-To-Current (V/I) resistance (Rs) 106 converts LNA signal output voltage into a signal current. Variability of Rs 106 allows introduction of additional attenuation in path between the LNA 104 and the passive mixer circuit 108. In this embodiment the passive mixer 108 down-converts the differential RF signal into a 4 phase quadrature IF signal, at the TIA outputs denoted as differential signals I and Q. One of ordinary skill will recognize alternative configurations in which the TIA may be utilized.

In an embodiment, each TIA 110 may include one or more feedback paths that comprise adjustable capacitance and resistance as represented by the variable feedback capacitors 112 and the variable feedback resistors 114. In an embodiment, the voltage gain of the TIA may be expressed as:

$$Gv = -\frac{Zfb}{Rs} \frac{1}{1 + \frac{Zfb + Rs}{A \cdot Rs}} \quad (1)$$

where Gv is the voltage gain, Zfb is the impedance of the feedback path, which includes the variable feedback capacitor 112 and the variable feedback resistor 114, Rs is the V/I resistance 106, and A is the open loop gain of the OPAMP used for the TIA 110. The variable feedback capacitors 112 and variable feedback resistors 114 illustrated in FIG. 1 are only intended to represent an equivalent of the adjustable gain feedback network described in further detail below with reference to FIGS. 4A-6.

Figure 2:
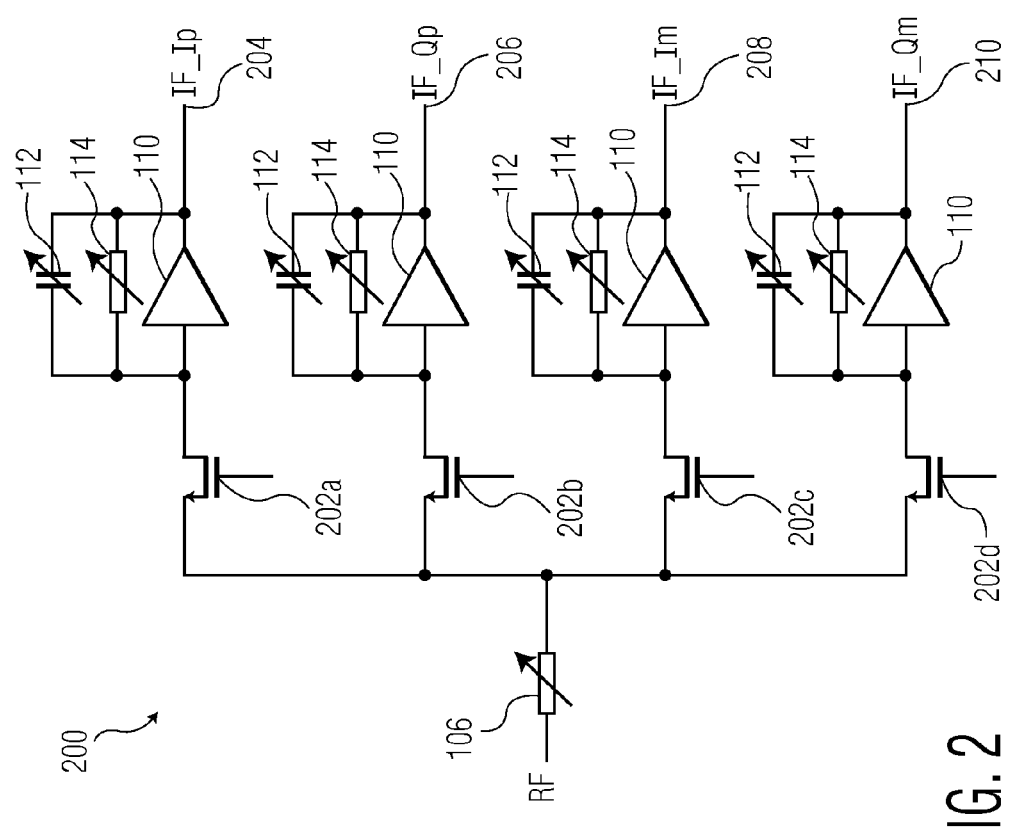
FIG. 2 depicts a schematic diagram of one embodiment of a system including a variable gain TIA.

FIG. 2 depicts more detail of a passive mixer 108 using variable gain TIA circuit 200 driven from a single-ended RF input signal. In an embodiment, the passive mixer 108 circuit 200 includes a plurality of TIAs 110, each TIA 110 having a feedback path comprising a variable feedback resistor 114 and a variable feedback capacitor 112. In some embodiments, the variable feedback resistor 114 and the variable feedback capacitor 112 may not be single components, but rather may include branches or networks of unit Resistor-Capacitor (RC) elements as described below with reference to FIG. 3. The variable gain TIA circuit 200 may include a V/I resistance 106 for further control of the gain of the variable gain TIA circuit 200.

In an embodiment, the variable gain TIA circuit 200 may be used in a quadrature receiver device as illustrated in FIG. 1. In such an embodiment, the gain of each TIA 110 may be adjusted by adjusting the ratio of the resistance of the V/I resistance 106 and the impedance of the feedback path which includes the variable feedback resistor 114 and variable feedback capacitor 112 associated with each TIA 110.

Figure 3:
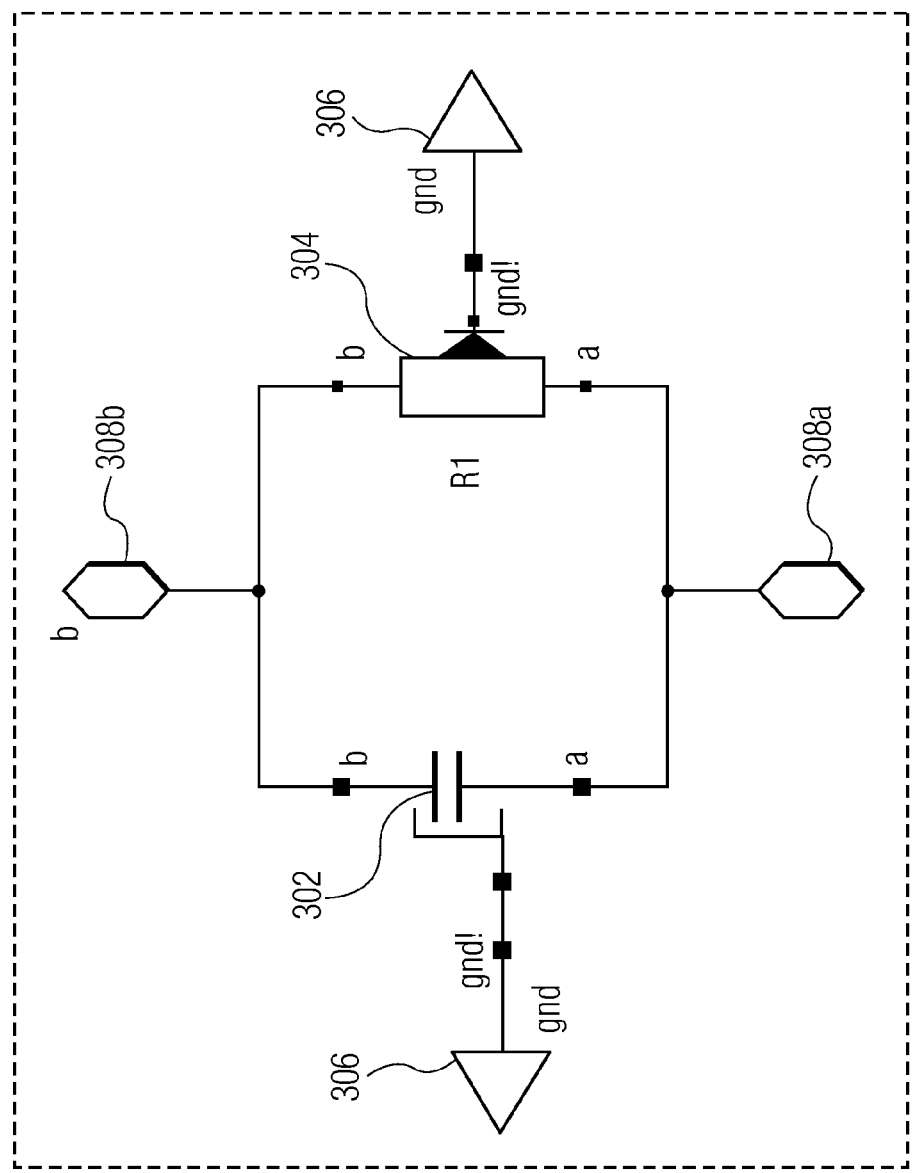
FIG. 3 depicts a schematic diagram of one embodiment of a unit RC element.
Figure 6:
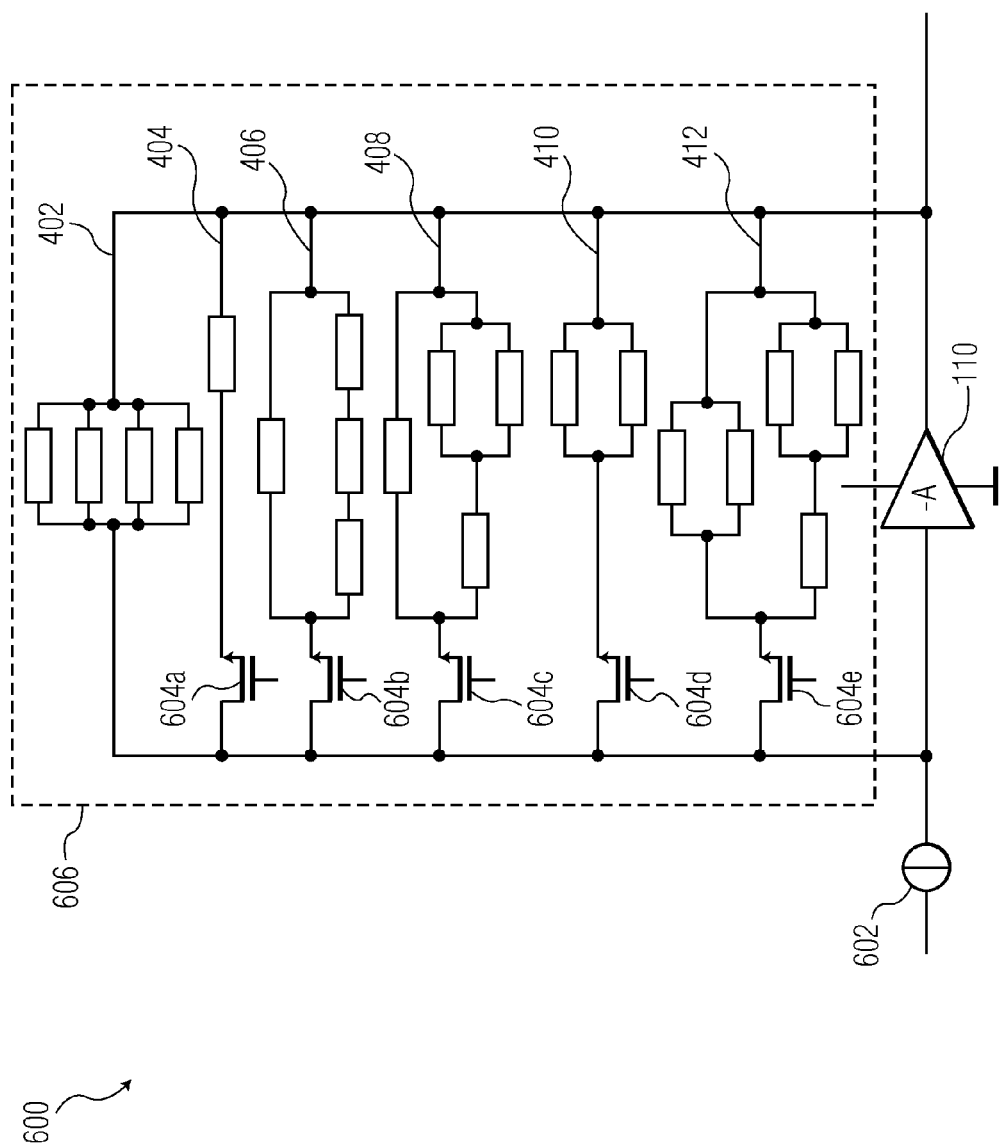
FIG. 6 depicts a schematic diagram of another embodiment of a variable gain TIA.

One of ordinary skill will appreciate that it may be useful to implement the present embodiments in an integrated circuit device. Rather, it may be beneficial to implement a unit RC element 300 as illustrated in FIG. 3 and to construct the required variable resistance and capacitance by combining multiple instantiations of unit RC element 300 as illustrated in FIGS. 4-6. A unit RC element 300 may be useful because the unit capacitor 302 and the unit resistor 304 may be set to a common or standard size within the integrated circuit, which may improve manufacturability and consistency of the unit RC element 300.

In such an embodiment, the unit RC element 300 may include a unit capacitor 302 and a unit resistor 304 arranged in parallel. Additionally, the unit capacitor 302 and the unit resistor 304 may be coupled to ground 306 to reduce transient degradation of the performance of the unit RC element 300. A first contact 308a and a second contact 308b may be provided for the unit RC element 300 to interface with other components of an integrated circuit. In some embodiments, as illustrated in FIGS. 4A-4F, and 6, branches of unit RC elements 300 may be arranged in predetermined configurations and selectively enabled or disabled to achieve a variable impedance in the feedback of a TIA 110.

In one embodiment, the unit resistor 304 may have a resistance value of 28 kΩ and the unit capacitor 302 may have a unit capacitance of 0.285 pF. The resistance and capacitance values may be determined by design specification and design manufacturing constraints. One of ordinary skill will recognize that any number of resistance values and capacitance values may be used for the unit RC element 300, depending on the design requirements of the integrated circuit for which the unit RC elements 300 are designed. One of ordinary skill will also recognize that the resistance value and capacitance value may vary slightly between unit RC elements 300, depending upon manufacturing tolerances.

Figure 4C:
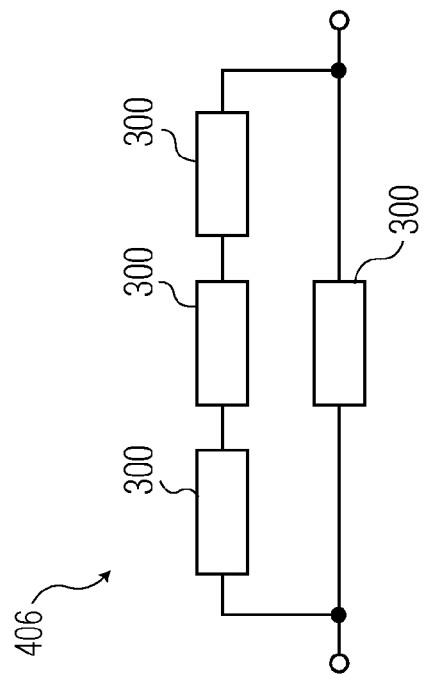
FIG. 4C depicts a schematic diagram of another embodiment of a feedback branch of a variable gain TIA.
Figure 4B:
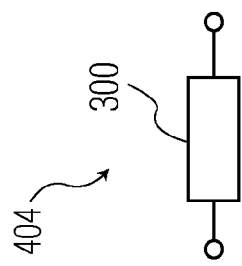
FIG. 4B depicts a schematic diagram of another embodiment of a feedback branch of a variable gain TIA.
Figure 4A:
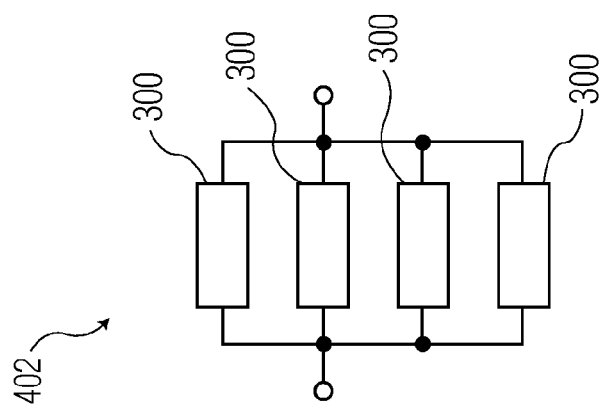
FIG. 4A depicts a schematic diagram of one embodiment of a feedback branch of a variable gain TIA.

FIG. 4A depicts a schematic diagram of one embodiment of a zero-gain RC branch 402. In an embodiment, the zero-gain RC branch 402 may be configured to match the V/I resistance 106, such that the voltage gain from LNA out to TIA out equals 0 dB (1×). In the depicted embodiment, the zero-gain RC branch 402 may include four unit RC elements 300 arranged in parallel. This configuration may be dependent upon the resistance values of the unit resistors 304 in the unit RC elements 300 as well as the resistance value of the V/I resistance 106. One of ordinary skill will recognize that four unit RC elements 300 have been depicted as one embodiment, but that any number of unit RC elements 300 may be combined, either in parallel or in series, depending upon gain step size, the resistance value required to match the V/I resistance 106 including resistance of switch 202. FIGS. 4B-4F depict various embodiments of gain step branches 404-412, which may be switched on or off to achieve predetermined gain steps as illustrated in FIG. 6. For illustrative purposes, gain steps of 2 decibels (dB) are described, and the associated gain step branches 404-412 are illustrated based upon an assumption that four unit RC elements 300 are used in the zero-gain RC branch 402. One of ordinary skill will recognize that greater or smaller gain steps may be implemented. One of ordinary skill will also recognize that more or fewer gain step branches may be used to implement gain steps. Additionally, one of ordinary skill will recognize that the specific configuration of each of the gain step branches 404-412 illustrated in FIGS. 4B-4C may be modified according to the gain step requirements.

Each of the gain step branches 404-412 may be configured with unit RC elements 300 to generate a branch resistance (Rfbi) and a branch capacitance (Cfbi). The combination of all active branches produces a total feedback resistance (Rfb), which was previously represented as variable feedback resistor 114 and a total feedback capacitance (Cfb), which was previously represented as variable feedback capacitor 112. For example, the first gain step branch 404 of FIG. 4B may have a branch resistance (Rfbi) equivalent to the resistance value of the unit resistor 304. In one embodiment, the resistance value may be 28 kΩ. When the first gain step branch 404 is combined with the zero-gain RC branch 402, the combination creates a path having a total resistance value (Rfb) of one-fifth (⅕) of the resistance value of the unit resistor 304. In the embodiment described with reference to FIG. 3, the total resistance value (Rfb) may be ⅕ of 28 kΩ, which is equal to 5.6 kΩ. In an embodiment, a variable feedback resistor 114 having a resistance of about 5.6 kΩ may produce a gain step of about minus two (−2) dB when used in combination with a constant V/I resistance 106.

FIG. 4C depicts a second gain step branch 406 that, when put in combination with the zero-gain branch 402, and the first gain step branch 404, creates a gain step of minus four (−4) dB from the original signal level.

The third gain step branch 408 (FIG. 4D) in combination with the zero-gain branch 402 (FIG. 4A), the first gain step branch 404 (FIG. 4B), and the second gain step branch 406 (FIG. 4C) produced a gain step of minus six (−6) dB. The third gain step branch 408 is illustrated in FIG. 4D.

Figure 4F:
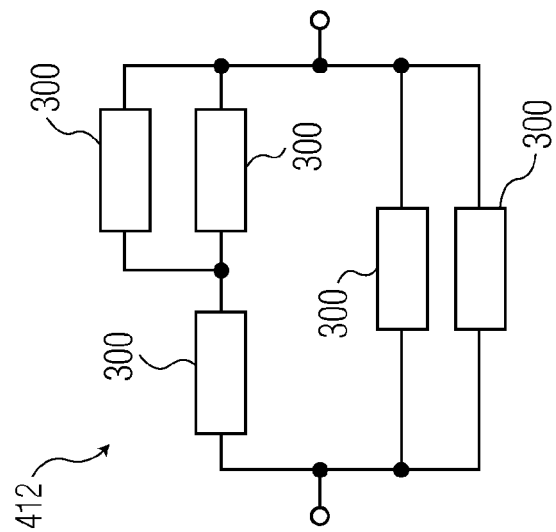
FIG. 4F depicts a schematic diagram of another embodiment of a feedback branch of a variable gain TIA.
Figure 4E:
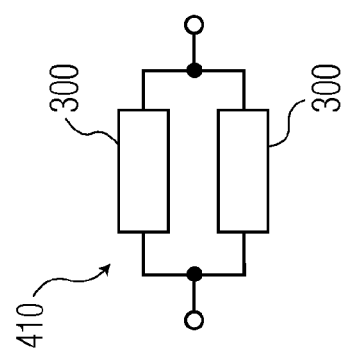
FIG. 4E depicts a schematic diagram of another embodiment of a feedback branch of a variable gain TIA.
Figure 4D:
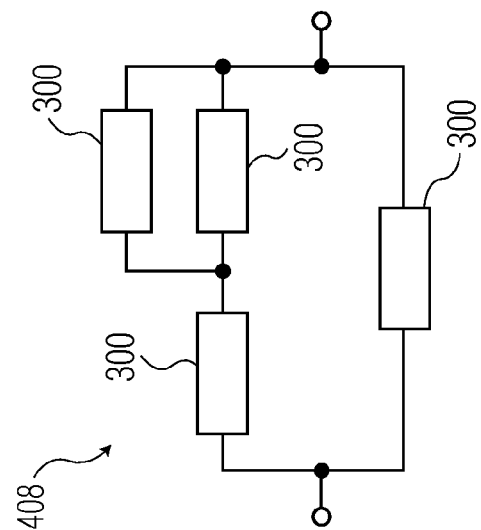
FIG. 4D depicts a schematic diagram of another embodiment of a feedback branch of a variable gain TIA.

FIGS. 4E and 4F illustrated a fourth gain step branch 410 and a fifth gain step branch 412 respectively, which each add another minus two (−2) dB gain step when combined with previously activated gain step branches 402-408.

FIG. 5 depicts a table 500 of gain steps associated with the embodiments of feedback branches illustrated in FIGS. 4A-4F. The table assumes open loop gain A of the operational amplifier to be very high so that gain is entirely determined by the feedback network, refer expression (1). Column 502 lists the gain step number for each gain step. Column 504 lists the gain step value produce by each gain step in decibels (dB). Column 506 lists the real voltage ratio generated by each gain step. Column 508 lists the ideal feedback resistance for generating the each gain step. Column 510 lists the ideal feedback capacitance associated with each ideal feedback resistance of column 508. Column 512 lists the ideal feedback resistance for each gain step branch 402-412 used to generate the gain steps. Column 514 lists the exact number of parallel unit RC elements 300 required to generate the ideal gain step. Column 516 lists the rounded number of parallel unit RC elements 300 used to achieve each gain step. Column 518 lists the estimated impedance of each gain step branch 402-412 used to implement the gain steps. Column 520 lists the estimated total feedback of the actual total feedback resistance of the combined gain step branches used to achieve each gain step. Column 522 is the actual gain step achieved using the unit RC elements 300 and column 524 lists the error for each gain step when implemented with unit RC elements 300.

One of ordinary skill will recognize that the values found in the table 500 of FIG. 5 are merely examples that may characterize one embodiment of a selectable gain TIA circuit such as the selectable gain TIA circuit 600 described in FIG. 6. One of ordinary skill will further recognize that modifications to the resistance value of the unit resistor 304 and the unit capacitor 302, or changes to the resistance value of the V/I resistance 106 may change the values found in the table 500. One of ordinary skill will also recognize that actual values corresponding to an integrated circuit, such as the selectable gain TIA circuit 600 of FIG. 6 may vary according to physical characteristics of components of the integrated circuit.

The selectable gain TIA circuit 600 of FIG. 6 may include a TIA 110 and an input interface 602, which may receive a signal to be amplified by the TIA 110. In an embodiment, input interface 602 may represent a signal current source that is a simplified representation of circuitry preceding the TIA 110. An adjustable feedback network 606 connected around operational amplifier 110 sets the gain and bandwidth of the resulting TIA 600. In an embodiment, the adjustable feedback network 606 may include multiple gain step branches 402-412. Each gain step branch 402-412 may be selectable by a gain step branch selector switch 604a-e.

In an embodiment, the zero-gain RC branch 402 may not include a selector switch 604 because the zero-gain RC branch 402 may be constantly active. In other embodiments, an additional gain step branch selector switch may be included for disabling the zero-gain RC branch 402. The gain characteristics associated with the zero-gain RC branch 402 are listed in the table 500 with reference to gain step number '0' of column 502. For example, the zero-gain RC branch may provide 0 dB of gain, have an ideal resistance value of 7 kΩ, and an ideal capacitance of 1.135 pF as shown in columns 504-512.

In one embodiment, the first gain step branch selector switch 604a may be enabled to switch the first gain step branch 404 in parallel with the zero-gain RC branch 402. The combination of the zero-gain RC branch 402 and the first gain step branch 404 provides an equivalent feedback resistance that is one-fifth (⅕) of the resistance value of the unit resistor 304, which is 5.6 kΩ in one embodiment. As listed in the table 500, the resistance value of the first gain step branch 404 is 28 kΩ as listed in column 518 for gain step number '1', and the total feedback resistance of the adjustable feedback network 604 is 5.6 kΩ, as listed in column 520 for gain step number '1'. The actual gain is −1.938 dB as shown in column 522. The deviation of the actual gain in column 522 from the expected gain in column 504 produced a gain error of 0.062 dB, as shown in column 524.

In an embodiment, each additional gain step branch 406-412 may be switched on by gain step branch selector switches 604*b-e* respectively. In an embodiment, the gain step branches 404-412 may be switched on sequentially, such that the total gain of the adjustable gain feedback network 606 is the equivalent impedance of each of the active branches in parallel. In another embodiment, the gain step branches 402-412 may selectively switched on, such that only a single gain step branch 402-412 is active at one time. One of ordinary skill will recognize additional configurations that may be employed, such as activating various combinations of gain step branches 402-412.

Figure 7:
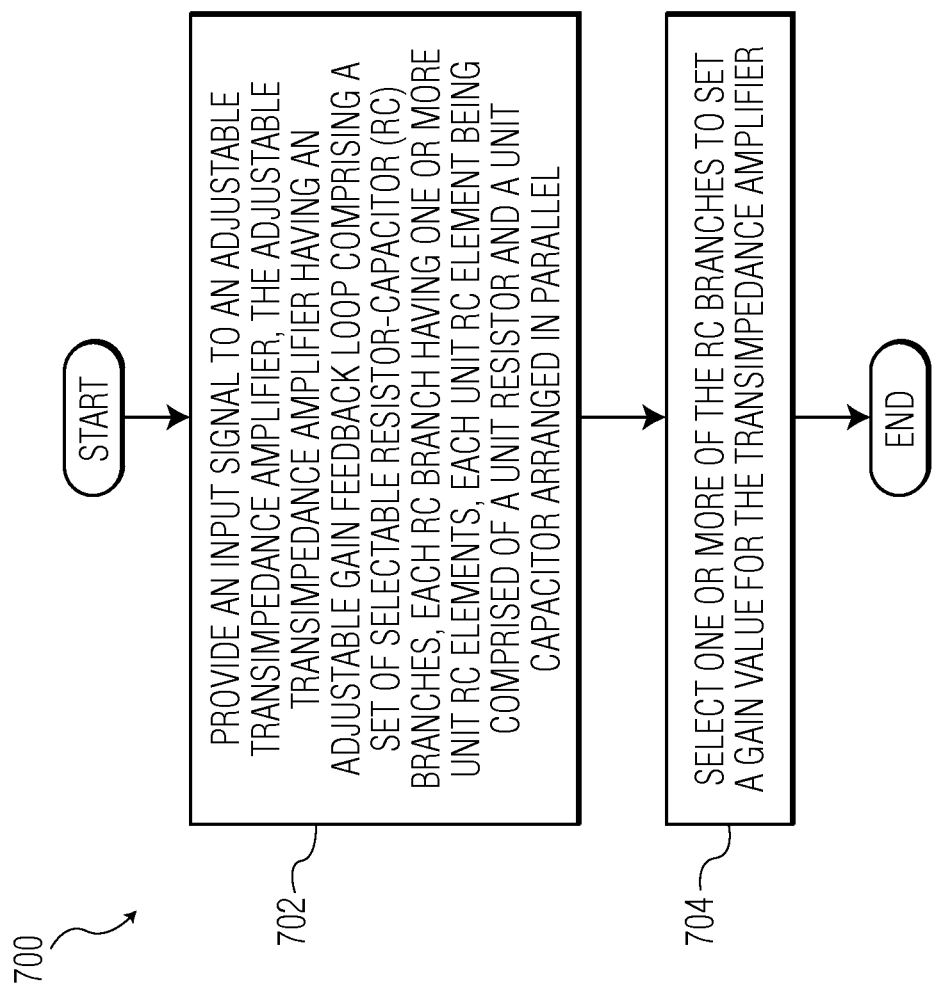
FIG. 7 depicts a schematic flowchart diagram illustrating one embodiment of a method for using a variable gain TIA.

FIG. 7 depicts a schematic flowchart diagram illustrating one embodiment of a method 700 for using a variable gain TIA 110. At block 702, the method 700 includes providing an input signal to an adjustable transimpedance amplifier, the adjustable transimpedance amplifier having an adjustable gain feedback network comprising a selectable set of RC branches, each RC branch having one or more unit RC elements, each unit RC element being comprised of a unit resistor 304 and a unit capacitor 302 arranged in parallel. At block 704, the method 700 includes selecting one or more of the RC branches to set a gain value for the transimpedance amplifier 110.

For example, in one embodiment, each RC branch may correspond to a 2 dB gain step. In such an embodiment, the gain step branch selector switches may be used to select the RC branch that corresponds to a desired gain step.

It should also be noted that at least some of the operations for the methods described herein may be implemented using firmware or software instructions stored on a readable storage medium for execution by a programmable logic device, such as an Application Specific Integrated Circuit (ASIC), a Field Programmable Gate Array (FPGA), a Programmable Logic Chip (PLC), a processor, or the like. As an example, an embodiment of a program product includes a firmware package stored on a flash memory device and configured to cause an FPGA to perform the operations described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A circuit comprising:
    an amplifier coupled to an adjustable gain feedback network, the adjustable gain feedback network including a selectable set of Resistor-Capacitor (RC) branches, at least one RC branch having one or more unit RC elements, at least one unit RC element being comprised of a unit resistor and a unit capacitor arranged in parallel, wherein the unit resistor and the unit capacitor are both connected to the ground; and
    wherein the RC branches are switched on sequentially such that a total gain of the adjustable gain feedback network is the equivalent impedance of at least one active RC branch.

2. The circuit of claim 1, further comprising an RC branch selector switch configured to combine a selection of the set of RC branches.

3. The circuit of claim 2, wherein the selection of the set of RC branches is combined in parallel.

4. The circuit of claim 2, wherein the selection of RC branches is combined in series.

5. The circuit of claim 2, wherein each RC branch in the set of RC branches induces a fixed gain step when activated.

6. The circuit of claim 1, wherein a resistance value of the unit resistor in each unit RC element is the same as the resistance value of the unit resistor in every other unit RC element in the selectable set of RC branches.

7. The circuit of claim 1, wherein a capacitance value of the unit capacitor in each unit RC element is the same as the capacitance value of the unit capacitor in every other unit RC element in the selectable set of RC branches.

8. An integrated circuit device comprising:
    an input interface configured to receive an input signal for an adjustable transimpedance amplifier; and
    an adjustable transimpedance amplifier comprising:
        an operational amplifier coupled to an adjustable feedback network the adjustable feedback network including a selectable set of Resistor-Capacitor (RC) branches, at least one RC branch having one or more unit RC elements, at least one unit RC element being comprised of a unit resistor and a unit capacitor arranged in parallel, wherein the unit resistor and the unit capacitor are both connected to the ground; and
    wherein the RC branches are switched on sequentially such that a total gain of the adjustable gain feedback network is the equivalent impedance of at least one active RC branch.

9. The integrated circuit device of claim 8, further comprising an RC branch selector switch configured to combine a selection of the set of RC branches.

10. The integrated circuit device of claim 9, wherein the selection of the set of RC branches is combined in parallel.

11. The integrated circuit device of claim 9, wherein the selection of RC branches is combined in series.

12. The integrated circuit device of claim 9, wherein each RC branch in the set of RC branches induces a fixed gain step when activated.

13. The integrated circuit device of claim 8, wherein a resistance value of the unit resistor in each unit RC element is the same as the resistance value of the unit resistor in every other unit RC element in the selectable set of RC branches.

14. A method comprising:
    providing an input signal to an adjustable transimpedance amplifier, the adjustable transimpedance amplifier having an adjustable gain feedback network comprising a set of selectable Resistor-Capacitor (RC) branches, at least one RC branch having one or more unit RC elements, at least one unit RC element being comprised of a unit resistor and a unit capacitor arranged in parallel, wherein the unit resistor and the unit capacitor are both connected to the ground;

selecting one or more of the RC branches to set a gain value for the transimpedance amplifier; and wherein the RC branches are switched on sequentially such that a total gain of the adjustable gain feedback network is the equivalent impedance of at least one active RC branch.

15. The method of claim 14, wherein selecting the one or more of the RC branches comprises switching an RC branch selector switch configured to combine a selection of the set of RC branches.

16. The method of claim 15, further comprising combining the selection of the set of RC branches in parallel.

17. The method of claim 15, further comprising combining the selection of the set of RC branches in series.

18. The method of claim 15, wherein determining the gain value comprises selecting one of a set of fixed gain steps.

19. The method of claim 14, wherein a resistance value of the unit resistor in each unit RC element is the same as the resistance value of the unit resistor in every other unit RC element in the selectable set of RC branches.

* * * * *